(12) United States Patent
Oguri

(10) Patent No.: US 7,852,111 B2
(45) Date of Patent: Dec. 14, 2010

(54) SEMICONDUCTOR DEVICE AND IMPEDANCE ADJUSTMENT METHOD OF THE SAME

(75) Inventor: Takashi Oguri, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/409,838

(22) Filed: Mar. 24, 2009

(65) Prior Publication Data
US 2009/0256586 A1    Oct. 15, 2009

(30) Foreign Application Priority Data

Apr. 11, 2008   (JP)   .............................. 2008-103387

(51) Int. Cl.
*H03K 17/16*    (2006.01)
(52) U.S. Cl. ....................................................... 326/30
(58) Field of Classification Search ................... 326/30
See application file for complete search history.

(56) References Cited

U.S. PATENT DOCUMENTS 7,288,959 B1 * 10/2007 Lee .............................. 326/30

FOREIGN PATENT DOCUMENTS

JP        2005039549 A      2/2005

\* cited by examiner

*Primary Examiner*—Rexford N Barnie
*Assistant Examiner*—Thienvu V Tran

(57) ABSTRACT

A 4-bit counter outputs a 4-bit counted value CNTp based on an up-and-down signal Sp supplied from a comparator. A weighting selection circuit performs weighting based on a deviation from an average value of the DC characteristic of each PMOS transistor, and assigns a transistor having the smallest deviation to Bit 1 (LSB) of the 4-bit counter. The weighting selection circuit assigns two PMOS transistors to Bit 2 of the 4-bit counter, four PMOS transistors to Bit 3, and eight PMOS transistors to Bit 4 (MSB). Then, the weighting selection circuit selects transistors P3-1 to P3-30 based on the counted value CNTp output from the 4-bit counter.

5 Claims, 5 Drawing Sheets

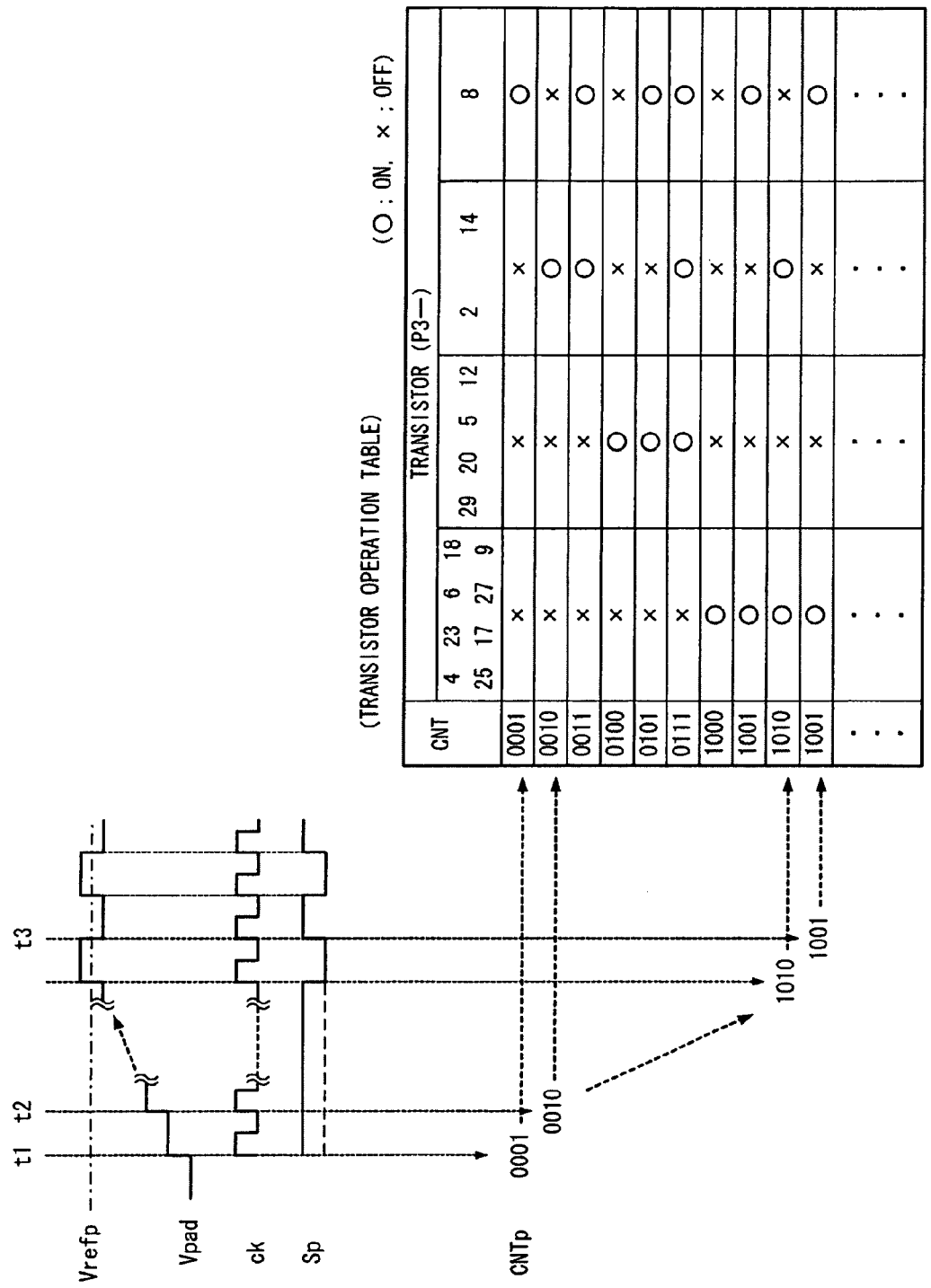

SEMICONDUCTOR DEVICE AND IMPEDANCE ADJUSTMENT METHOD OF THE SAME

INCORPORATION BY REFERENCE

This application is based on Japanese Patent Application No. 2008-103387 filed on Apr. 11, 2008 and including specification, claims, drawings and summary. The disclosure of the above Japanese Patent Application is incorporated herein by reference in its entirety.

TECHNICAL FIELD

The present invention relates to a semiconductor device and an impedance control method of the same.

BACKGROUND ART

As a semiconductor integrated circuit, there is an integrated circuit that incorporates a termination resistor in order to realize a high-speed interface operation in particular.

For example, in the output of an output buffer circuit that interfaces at a high speed, a resistor has been incorporated into an LSI or has been added to the outside of the LSI. These days, in order to further increase the accuracy, some LSIs have impedance adjustment circuits mounted therein.

In a high-speed interface, it is essential to match the impedances between a transmitter circuit and a receiver circuit, and transmission lines between LSIs. This is because the impedance mismatch between a transmission line and a load generates a reflected wave and the reflected wave causes a malfunction of an input buffer.

Moreover, in such a method of incorporating a resistor into an LSI or externally attaching a resistor as described above, the size of a MOS transistor needs to be increased. However, if the size of a MOS transistor is increased, the housing capacity in the internal area of an LSI will decrease and a penetrating current will increase. Therefore, the noise and power consumption will also increase.

Then, in order to solve such problems, an impedance adjustment circuit has been provided. For this adjustment method, a method of adjusting to an accurate external resistive element is prevailing. The addition of an impedance adjustment circuit eliminates the need to increase the size of an MOS transistor, can improve the housing capacity, can reduce the noise and power consumption, and can also set the interface at a high speed. Such technique is described in Unexamined Japanese Patent Application KOKAI Publication No. 2005-39549, for example.

In recent years, there has been a need for the accuracy of the impedance adjustment circuit and also a need to further increase the speed of an interface. For this reason, there has been a need for detection accuracy in the level of impedance that is converted in potential. As an example of the technology in these days, several mV of difference in detecting the potential needs to be detected at a supply voltage of 1 V.

Moreover, the miniaturization has been progressing in the semiconductor integrated circuit. This miniaturization also increases the variation inside a semiconductor chip, and this variation needs to be taken into account. As a local variation model, the model by Pelgrom et al. is known. However, due to such a variation, a differential circuit capable of detecting several mV cannot be prepared by employing the conventional circuit system.

SUMMARY

The present invention has been made in view of such conventional problems. It is an exemplary object of the present invention to provide a semiconductor device capable of improving the accuracy in the impedance adjustment, and an impedance control method of the semiconductor device.

In order to achieve the above-described object, a semiconductor device according to a first exemplary aspect of the present invention comprises:

an array circuit comprising a plurality of transistors connected in parallel, of which the respective impedance characteristics are known;

an impedance comparing element that compares a reference impedance with an impedance of the array circuit and outputs a result of the comparison;

a counter, which counts up or counts down the count value in accordance with the result of comparison output by the impedance comparing element; and a controller which assigns a transistor having a smallest deviation from a representative value of the impedances of the transistors of the array circuit, to the least significant bit of the counter, and assigns $2^{(k-1)}$ number of transistors of other transistors to the k-th bit, where k is a natural number equal to or greater than 2, and turns on or off each transistor assigned to each bit of the count value based on the value of each bit.

Here, the array circuit may include more transistors than the transistors assigned to all the bit values of the counter, and the controller may select a transistor having an impedance characteristic whose deviation from the representative value is small, from the transistors which the array circuit includes.

An impedance adjustment method of a semiconductor device according to a second exemplary aspect of the present invention is a method of adjusting impedance of an array circuit, the method comprising:

an impedance comparison step of comparing a reference impedance with an impedance of an array circuit comprising a plurality of transistors connected in parallel, the respective impedance characteristics of which are known and outputting a result of the comparison and outputting the result of comparison;

a step of updating a count value in response to a clock signal and in accordance with the result of comparison output in the impedance comparison step, and outputting the count value in a binary value;

a step of assigning a transistor having a smallest deviation from a representative value of the impedances of the transistors of the array circuit, to the least significant bit of the count value, and assigning $2^{(k-1)}$ number of transistors of other transistors to the k-th bit, where k is a natural number equal to or greater than 1, and turns on or off each transistor assigned to each bit of the count value based on the count value output by the counter.

An impedance adjustment means according to a third exemplary aspect of the present invention is a means of adjusting impedance of an array circuit, the means comprising:

impedance comparing means that compares a reference impedance with an impedance of the array circuit and outputs a result of the comparison;

counter means, which counts up or counts down the count value in accordance with the result of comparison output by the impedance comparing means; and controller means which assigns a transistor having a smallest deviation from a representative value of the impedances of the transistors of the array circuit, to the least significant bit of the counter means, and assigns $2^{(k-1)}$ number of transistors of other transistors to the k-th bit, where k is a natural number equal to or greater than 2, and turns on or off each transistor assigned to each bit of the count value based on the value of each bit.

According to the present invention, the accuracy of the impedance adjustment can be improved.

BRIEF DESCRIPTION OF THE DRAWINGS

These objects and other objects and advantages of the present invention will become more apparent upon reading of the following detailed description and the accompanying drawings in which:

FIG. 5 is a view showing an operation of an impedance adjustment circuit for PMOS.

EXEMPLARY EMBODIMENT

Hereinafter, a semiconductor circuit according to an embodiment of the present invention will be described with reference to the accompanying drawings. Note that, in this embodiment, the semiconductor circuit will be described as an LSI (Large Scale Integrated circuit).

Figure 1:
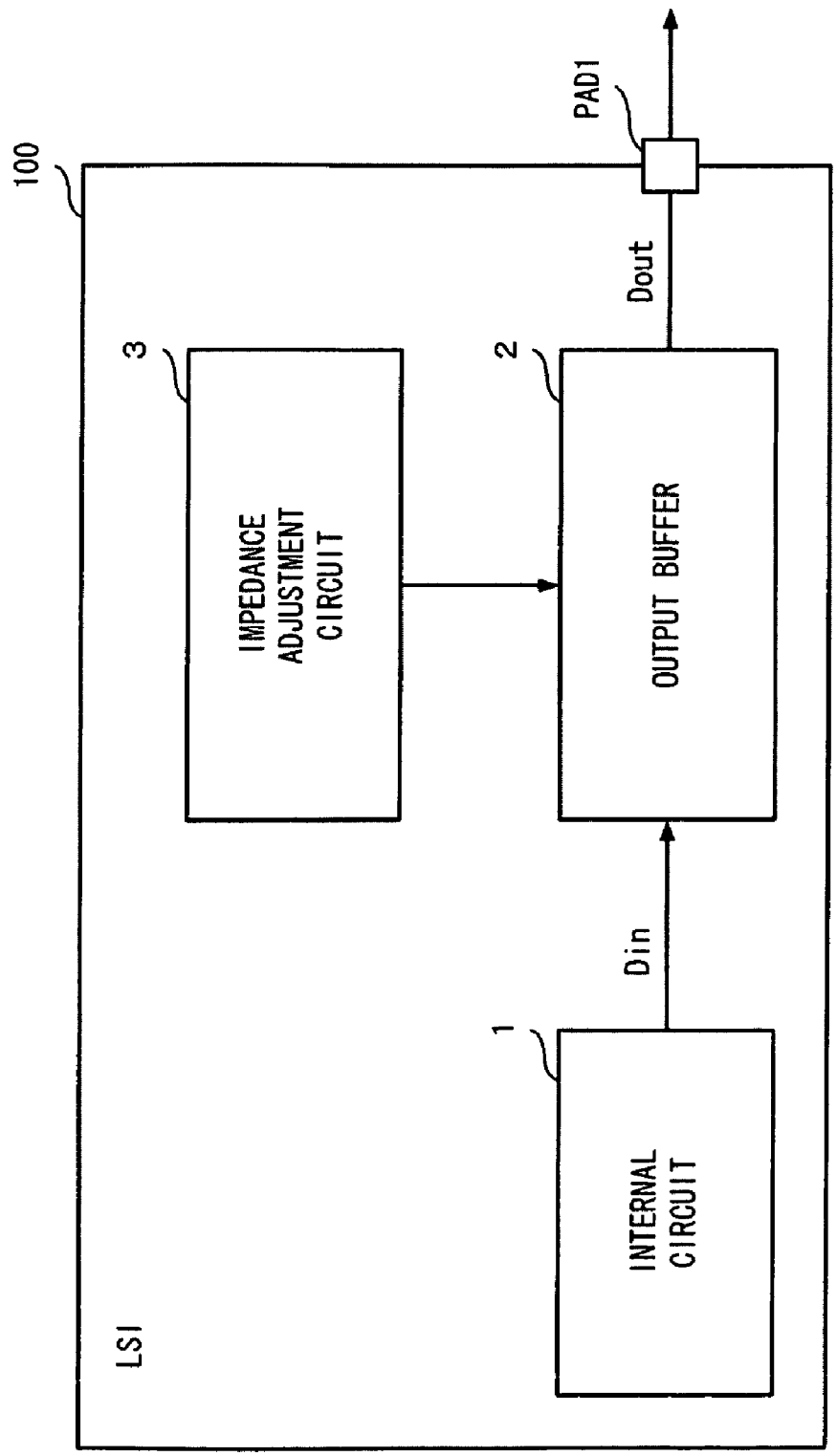
FIG. 1 is a block diagram showing a configuration of an LSI as a semiconductor circuit according to an embodiment of the present invention.

A configuration of an LSI 100 according to this embodiment is shown in FIG. 1.

The LSI 100 according to this embodiment comprises an internal circuit 1, an output buffer 2, and an impedance adjustment circuit 3.

The internal circuit 1 performs various signal processings and outputs a signal Din to be output to the outside of the LSI 100. The signal Din is a binary signal having a high level and a low level.

The output buffer 2 outputs the output signal Din from the internal circuit 1 as a signal Dout by expanding its dynamic range and current drive capability. This signal Dout is output to the outside via an output terminal PAD 1 of the LSI 100.

Figure 2:
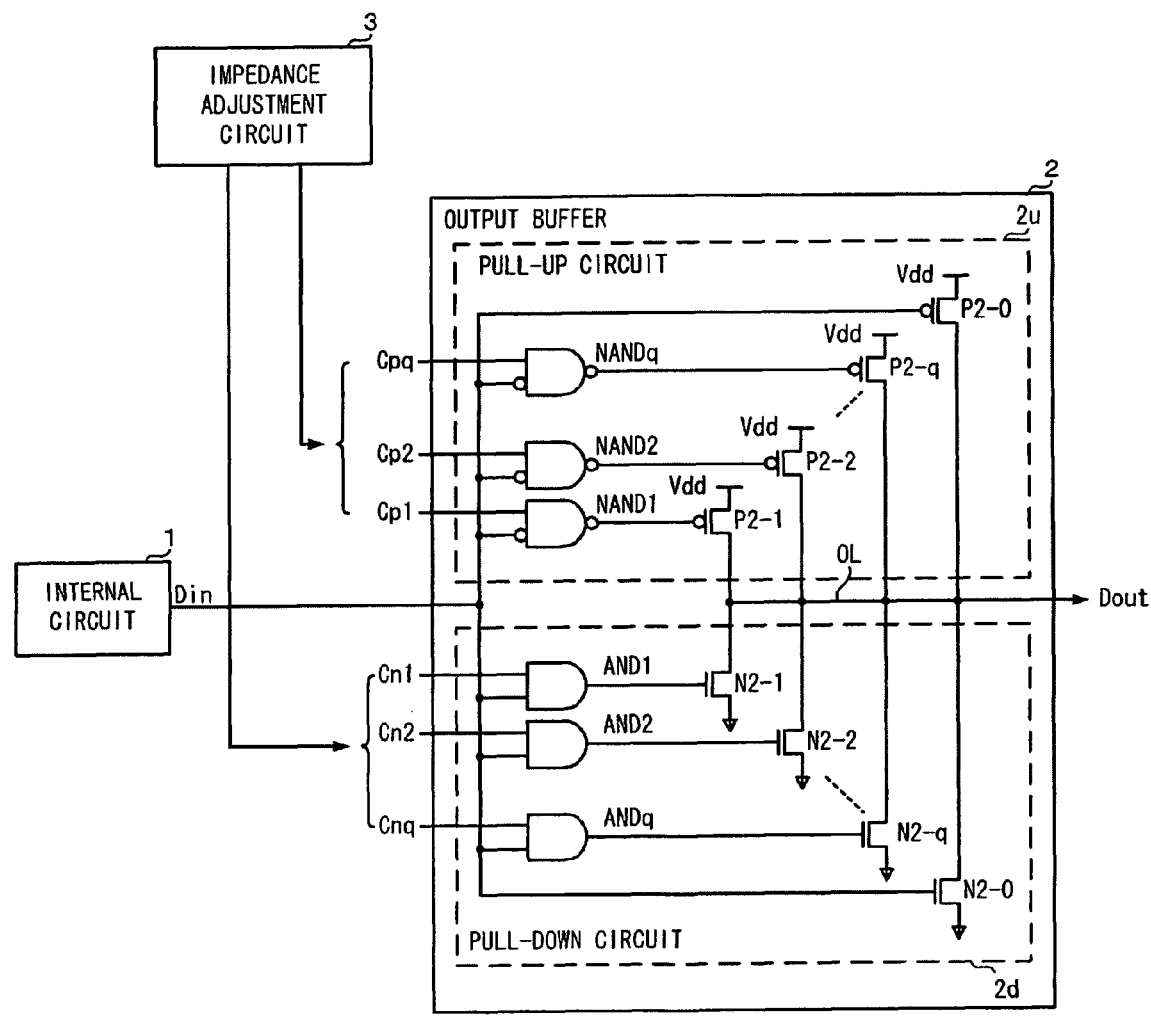
FIG. 2 is a circuit diagram showing a configuration of an output buffer shown in FIG. 1.

The output buffer 2 comprises a pull-up circuit 2u and a pull-down circuit 2d as shown in FIG. 2.

The pull-up circuit 2u is a circuit for pulling up the voltage of an output line OL for outputting the signal Dout, to a power supply voltage Vdd. The pull-up circuit 2u comprises transistors P2-0 to P2-q (q; natural number equal to or greater than 2), and NAND (NAND gate) 1 to NANDq.

The transistors P2-0 to P2-q are PMOS (Positive-channel Metal-Oxide Semiconductor) transistors. The respective drains of transistors are connected to the output line OL and the respective sources are connected to a power supply of voltage Vdd. The signal Din is supplied to the gate of the transistor P2-0.

The on-resistances between source and drain of the transistors P2-1 to P2-q are weighted, and if the on-resistance of the transistor P2-1 is Rp1 and the conductance of the transistor is Cp1, the on-resistance of the transistor P2-2 is 2×Rp1 and the conductance is ½×Cp, and so on.

Moreover, the on-resistance and conductance of the transistor P2-q are suitably set so that the impedance of a parallel circuit of the transistors P2-1 and P2-q may agree with a targeted output impedance of the output buffer 2, for example.

NAND1 to NANDq are gates for selecting the transistors P2-1 to P2-q. The inverting input terminals of NAND1 to NANDq are connected to the data input terminal, to which the data Din from the internal circuit 1 is input. Moreover, to the non-inverting terminals of NAND1 to NANDq, each of the bits of PCB1 (LSB) to PCBq (MSB) of a binary control signal from the impedance adjustment circuit 3 is input on a one-to-one basis, respectively.

The output terminals of NAND1 to NANDq are connected to the gates of the transistors P2-1 to P2-q, respectively. The signal Din is directly supplied to the gate of the transistor P2-0.

The transistors P2-0 to P2-q are turned on to pull up the voltage of the signal line to the voltage Vdd when the input signal is at a low (L) level, and these transistors are turned off when the input signal is at a high (H) level.

However, since NAND1 to NANDq are opened and closed in response to the values of the binary control signals PCB1 (LSB) to PCBq (MSB) supplied from the impedance adjustment circuit 3, a combination of the transistors P2-1 to P2-q that can be turned on is determined by the binary control signals PCB1 to PCBq.

The binary control signals PCB1 to PCBq are set so that the combined resistance of the turned-on transistors P2-1 to P2-q may agree with the resistance value of a high precision external resistor for impedance adjustment.

The pull-down circuit 2d comprises transistors N2-0 to N2-q and AND (AND gate) 1 to ANDq.

The transistors N2-0 to N2-q are NMOS (Negative-channel Metal-Oxide Semiconductor; N channel metal oxide semiconductor) transistors. The respective drains of transistors are connected to the output line OL and the respective sources are grounded. The signal Din is supplied to the gate of the transistor N2-0.

The on-resistances between source and drain of the transistors N2-1 to N2-q are weighted, and if the on-resistance of the transistor N2-1 is Rn1 and the conductance of the transistor is Cn1, the on-resistance of the transistor N2-2 is 2×Rn1 and the conductance is ½×Cn, and so on.

Moreover, the on-resistance and conductance of the transistor N2-q are suitably set so that the impedance of a parallel circuit of the transistors N2-1 and N2-q may agree with a targeted output impedance of the output buffer 2, for example.

One of the input terminals of AND1 to ANDq is connected to the data input terminal, to which the signal Din from the internal circuit 1 is input. Moreover, to the other input terminals of AND1 to ANDq, each of the bits of NCB1 (LSB) to NCBq (MSB) of a binary control signal from the impedance adjustment circuit 3 is input on a one-to-one basis, respectively.

The output terminals of AND1 to ANDq are connected to the gates of the transistors N2-1 to N2-q, respectively. The signal Din is directly supplied to the gate of the transistor N2-0.

Basically, the transistors N2-1 to N2-q are turned on to pull down the voltage of the signal line to the ground level when the input signal is at a high (H) level, and these transistors are turned off when the input signal is at a low (L) level.

However, since AND1 to ANDq are opened and closed in response to the values of the binary control signals NCB1 to NCBq supplied from the impedance adjustment circuit 3, a combination of the transistors N2-1 to N2-q that can be turned on is determined by the binary control signals NCB1 to NCBq.

As described later, the binary control signals NCB1 to NCBq are set so that the combined resistance of the turned-on transistors N2-1 to N2-q may agree with the resistance value R2 of a high precision external resistor (reference resistance) for impedance adjustment.

Figure 3:
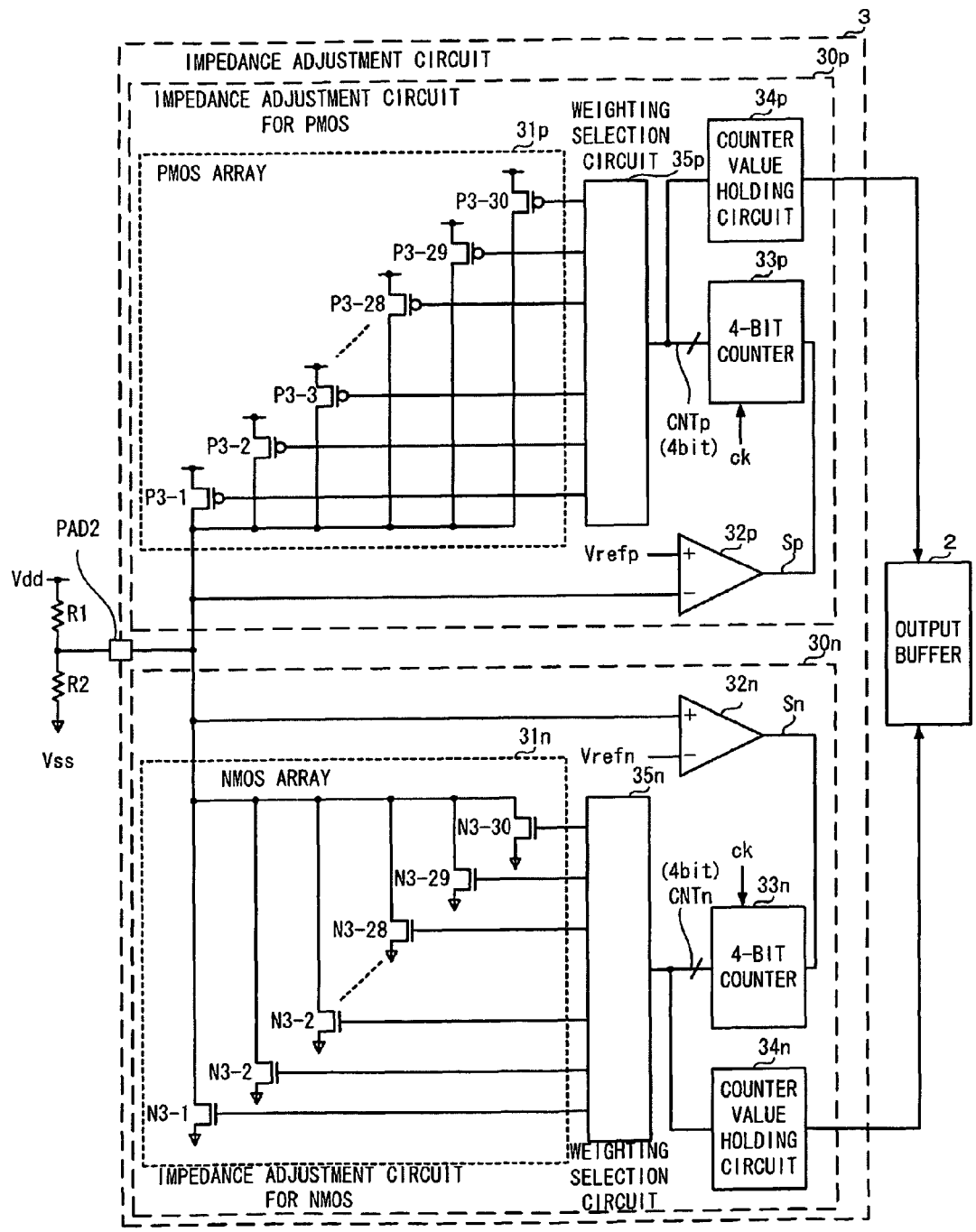
FIG. 3 is a circuit diagram showing a configuration of an impedance adjustment circuit shown in FIG. 2.

The impedance adjustment circuit 3 is a circuit provided for adjusting the output impedance of the output buffer 2. As shown in FIG. 3, the impedance adjustment circuit 3 comprises an impedance adjustment circuit for PMOS 30p and an impedance adjustment circuit for NMOS 30n.

Note that the impedance adjustment circuit 3 is provided with a terminal PAD2. A resistor R1 and a resistor R2 are connected to the terminal PAD2.

The resistor R1 and the resistor R2 are resistors serving as the reference for impedance adjustment. A predetermined voltage Vdd is applied to one end of the resistor R1. One end of the resistor R2 is connected to the other end of the resistor R1. Then, a predetermined voltage Vss is applied to the other end of the resistor R2.

The terminal PAD2 is connected to the connection point between the resistor R1 and the resistor R2, and a potential Vpad divided by the resistors R1 and R2 is applied to the terminal PAD2.

The impedance adjustment circuit for PMOS 30p comprises a PMOS array 31p, a comparator 32p, a 4-bit counter 33p, a counter value holding circuit 34p, and a weighting selection circuit 35p.

The PMOS array 31p is a circuit for pulling up the voltage Vpad of the terminal PAD2, and is a circuit for simulating the operation and characteristics of the pull-up circuit 2u of the output buffer 2. In other words, the PMOS array 31p is a circuit for dividing the supply voltage Vdd along with the resistor R1 connected to the terminal PAD2.

The PMOS array 31p comprises a plurality of PMOS type transistors P3-1 to P3-30.

The transistors P3-1 to P3-30 are connected in parallel, respectively. That is, the supply voltage Vdd is applied to each source of the transistors P3-1 to P3-30. Each drain of the transistors P3-1 to P3-30 is connected to the terminal PAD2, and the gates of the transistors P3-1 to P3-30 are connected to the weighting selection circuit 35p.

The impedance characteristics of these transistors P3-1 to P3-30 are known, respectively.

There are usually variations in the characteristics of the transistors P3-1 to P3-30. For this reason, the PMOS array 31p includes more transistors P3-1 to P3-30 than 15 transistors assigned to all the bit values of the 4-bit counter 33p.

In this way, the PMOS array 31p includes a lot of transistors P3-1 to P3-30, thereby making it possible to select transistors in ascending order of the deviation from an average value as a representative value of the impedance characteristics.

These transistors P3-1 to P3-30 are formed inside the LSI 100 so that the measurement of each DC characteristics as the impedance characteristics is possible. Current measurement of voltage force or voltage measurement of current force is performed in advance, so that the impedance characteristics are known.

For example, since there are 30 PMOS transistors of the transistors P3-1 to P3-30, the transistors P3-1 to P3-30 are manufactured so as to be able to be selected by a 5-bit binary counter from outside the LSI 100.

The comparator 32p compares a reference potential Vrefp with the potential Vpad of the terminal PAD2, and supplies an up-and-down signal Sp to the 4-bit counter 33p as the comparison result. The reference potential Vrefp is a predetermined potential for indicating a reference impedance, while the potential Vpad of the terminal PAD2 is a potential for indicating an impedance set by the PMOS array 31p.

The reference potential Vrefp is applied to a non-inverting input termninal (+) of the comparator 32p, and an inverting input terminal (−) is connected to the terminal PAD2. The comparator 32p outputs the signal Sp of a high level when the voltage Vpad is higher than the reference potential Vrefp applied to the non-inverting input terminal (+), and outputs the signal Sp of a low level when the voltage Vpad is lower than the reference potential Vrefp.

The 4-bit counter 33p generates a 4-bit counted value CNTp based on the up-and-down signal Sp supplied from the comparator 32p.

A clock signal ck is supplied to the 4-bit counter 33p. The 4-bit counter 33p increments the counted value CNTp by one at the rising edge of the clock signal ck when the up-and-down signal Sp supplied from the comparator 32p is at a high level, and decrements the counted value CNTp by one when the up-and-down signal Sp is at a low level.

The 4-bit counter 33p supplies the generated 4-bit counted value CNTp to the counter value holding circuit 34p and the weighting selection circuit 35p.

The counter value holding circuit 34p holds the counted value CNTp supplied from the 4-bit counter 33p, and supplies the binary control signals PCB1 to PCBq to the output buffer 2 based on the counted value CNTp held.

The weighting selection circuit 35p selects either of the transistors P3-1 to P3-30 based on the counted value CNTp supplied from the 4-bit counter 33p.

During normal operation, a mechanism of weighting the selected 15 PMOS transistors by a binary code is established. As the method of establishing this mechanism, a method of establishing through the impedance adjustment circuit 3 or a method of establishing through FW are contemplated.

That is, the weighting selection circuit 35p performs weighting of the transistors P3-1 to P3-30 based on deviations from an average value of the DC characteristics of each of the transistors P3-1 to P3-30 of the PMOS array 31p.

Then, the weighting selection circuit 35p assigns a PMOS transistor having the smallest deviation to the LSB (least significant bit) of the 4-bit counter 33p, and assigns, according to the weighting, $2^{(k-1)}$ transistors to the k-th (k; natural number equal to or greater than 1) bit (or the bit k), such as assigning two transistors to the 2nd bit, four transistors to the 3rd bit, and eight transistors to the 4th bit (MSB).

In this manner, the groups of transistors, to which weighting for selecting 15 transistors P3-1 to P3-30 and 15 transistors N3-1 to N3-30, respectively, by use of the counter values of the 4-bit counters 32p and 32n of the impedance adjustment circuit 3 has been performed, are established.

The weighting selection circuit 35p performs such weighting, and further selects and turns on/off the transistors assigned to each bit based on the counted value CNTp which the 4-bit counter 33p outputs.

The impedance adjustment circuit for NMOS 30n comprises an NMOS array 31n, a comparator 32n, a 4-bit counter 33n, and a counter value holding circuit 34n, and a weighting selection circuit 35n.

The NMOS array 31n is a circuit for pulling down the voltage Vpad of the terminal PAD2, and is a circuit for simulating the operation and characteristics of the pull-down circuit 2d of the output buffer 2. In other words, the NMOS array 31n is a circuit for dividing the supply voltage Vdd along with the resistor R1 connected to the terminal PAD2.

The NMOS array 31n comprises NMOS transistors N3-1 to N3-30.

The transistors N3-1 to N3-30 are connected in parallel, respectively. That is, each drain of the transistors N3-1 to N3-30 is connected to the terminal PAD2, and the supply voltage Vss is applied to the sources thereof. The gates of the transistors N3-1 to N3-30 are connected to the weighting selection circuit 35n.

For the NMOS transistors, as with the PMOS transistors, 30 transistors N3-1 to N3-30 are formed even when 15 transistors are used at each time, so that transistors having a small variation of the characteristics can be selected.

These transistors N3-1 to N3-30 are formed inside the LSI 100 so that the measurement of each DC characteristics is possible. Current measurement of voltage force or voltage measurement of current force is performed in advance, so that the impedance characteristics are known.

The comparator 32n compares a reference potential Vrefn that is pre-set for indicating a reference impedance, with the potential Vpad of the terminal PAD2 indicating an impedance set by the NMOS array 31n, and supplies an up-and-down signal Sn to the 4-bit counter 33n as the a result of the comparison. * The reference potential Vrefn is applied to an inverting input terminal (−) of the comparator 32n, and a non-inverting input terminal (+) is connected to the terminal PAD2. The comparator 32n outputs the signal Sn of a low level when the voltage Vpad is higher than the reference potential Vrefn applied to the inverting input terminal (−), and outputs the signal Sn of a high level when the voltage Vpad is lower than the reference potential Vrefn.

The 4-bit counter 33n generates a 4-bit counted value CNTn based on the up-and-down signal Sn supplied from the comparator 32n.

The clock signal ck is supplied to the 4-bit counter 33n. The 4-bit counter 33n decrements the counted value CNTn by one at the rising edge of the clock signal ck when the up-and-down signal Sn supplied from the comparator 32n is at a high level, and increments the counted value CNTn by one when the up-and-down signal Sn is at a low level.

The 4-bit counter 33n supplies the generated 4-bit counted value CNTn to the counter value holding circuit 34n and the weighting selection circuit 35n.

The counter value holding circuit 34n holds the counted value CNTn supplied from the 4-bit counter 33n, and supplies the binary control signals NCB1 to NCBq to the output buffer 2 based on the counted value CNTn held.

The weighting selection circuit 35n selects either of the transistors N3-1 to N3-30 based on the counted value CNTn supplied from the 4-bit counter 33n.

The weighting selection circuit 35n performs weighting of the transistors N3-1 to N3-30 based on deviations from an average value of the DC characteristics of each of the transistors N3-1 to N3-30 of the NMOS array 31n.

Then, the weighting selection circuit 35n assigns a transistor having the smallest deviation to the LSB (least significant bit) of the 4-bit counter 33n, and assigns $2^{(k-1)}$ transistors to the k-th (k; natural number equal to or greater than 1) bit (or the bit k), such as assigning two transistors to the 2nd bit, four transistors to the 3rd bit, and eight transistors to the 4th bit (MSB).

In this manner, the groups of transistors, to which weighting for selecting 15 transistors P3-1 to P3-30 and 15 transistors N3-1 to N3-30, respectively, by use of the counter values CNTp and CNTn of the 4-bit counters 32p and 32n of the impedance adjustment circuit 3 has been performed, are established.

The weighting selection circuit 35n performs such weighting, and further selects and turns on/off the transistors assigned to each bit based on the counted value CNTn which the 4-bit counter 33n outputs.

Next, the impedance adjustment operation of the LSI 100 according to this embodiment is described.

In the case of the PMOS transistors, assume that in ascending order of the deviation from an average value of the DC characteristics, the transistors P3-8, P3-2, P3-14, P3-29, P3-20, P3-5, P3-12, P3-4, P3-23, P3-6, P3-18, P3-25, P3-17, P3-27, and P3-9 have been selected.

The weighting selection circuit 35p, during normal operation, performs weighting of these 15 selected transistors by a binary code.

Figure 4:
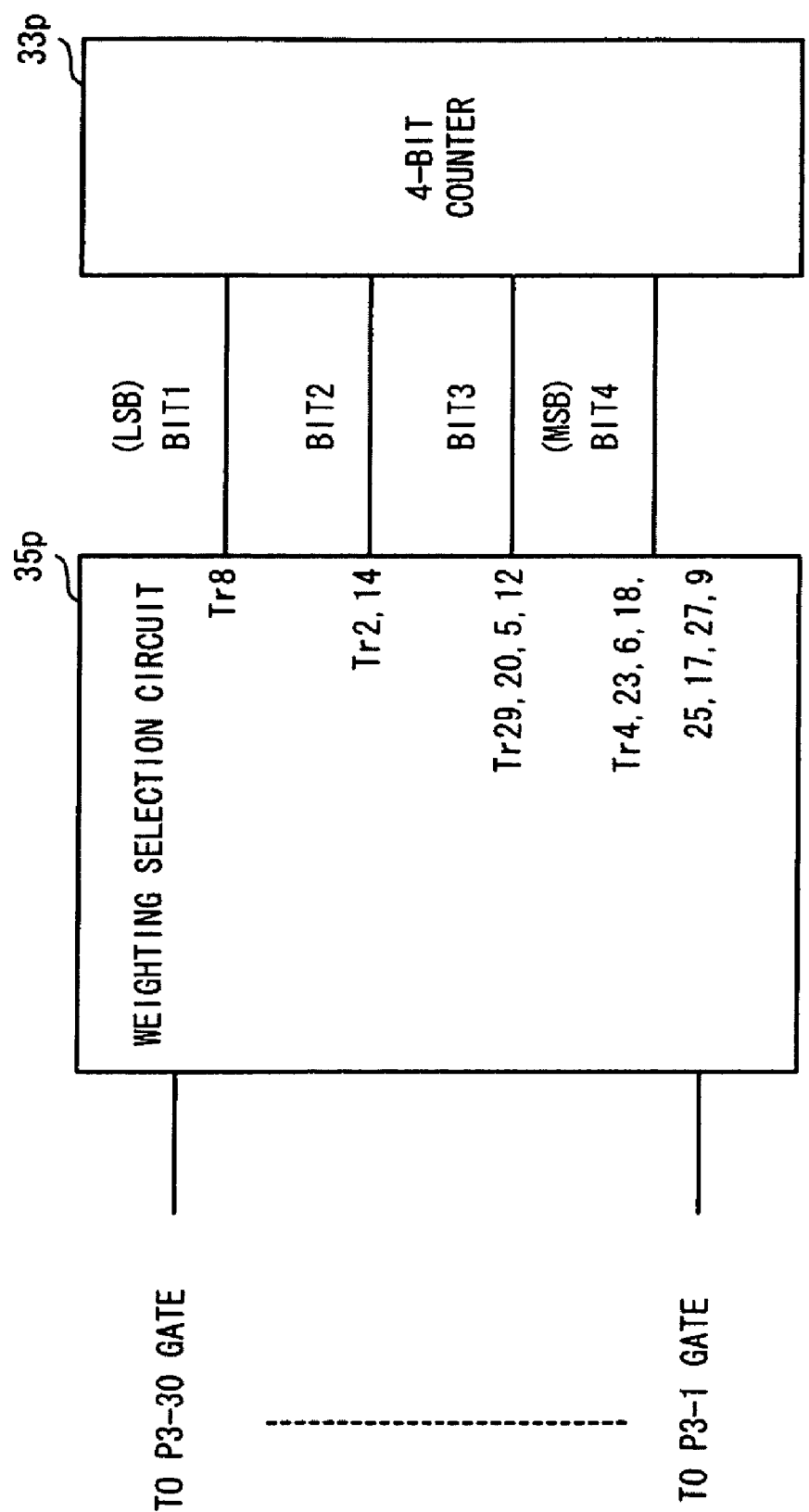
FIG. 4 is a view showing a specific example of weighting of each bit with respect to a 4-bit counter of a weighting selection circuitry.

In this case, in the weighting selection circuit 35p, as shown in FIG. 4, one transistor P3-8 is assigned to Bit 1 of the least significant bit (LSB) of the 4-bit counter 3p ($1=2^0$, where "^" represents exponentiation).

Similarly, ($2=2^1$) transistors P3-2 and P3-14 are assigned to Bit 2, and ($4=2^2$) transistors P3-29, P3-20, P3-5, and P3-12 are assigned to Bit 3.

Then, ($8=2^3$) transistors P3-4, P3-23, P3-6, P3-18, P3-25, P3-17, P3-27, and P3-9 are assigned to the most significant bit (MSB) Bit 4.

As shown in FIG. 5, at a time instance t1, when the voltage Vpad of the terminal PAD2 is lower than the reference potential Vrefp, the comparator 32p supplies the signal Sp of a high level to the 4-bit counter 33p. Note that, hereinafter, the operation of the impedance adjustment circuit for NMOS 31n is assumed to be fixed.

Upon supply of the signal of a high level from the comparator 32p, the 4-bit counter 33p sets 1 to Bit 1 (LSB) and outputs the counted value CNTp="0001".

When the counted value CNTp="0001" is output from the 4-bit counter 33p, the weighting selection circuit 35p selects the transistor P3-8 assigned to Bit 1 and supply the signal of L level to the gate of the transistor P3-8.

As shown in a transistor operation table of FIG. 5, the signal of L level is supplied to the gate of the transistor P3-8, which is then turned on. When the transistor P3-8 is turned on, the voltage Vpad will increase.

Next, also at a time instance t2 at which the clock signal ck rises, similarly, when the voltage Vpad of the terminal PAD2 is lower than the reference potential Vrefp, the comparator 32p supplies the signal Sp of a high level to the 4-bit counter 33p.

Upon supply of the signal of a high level from the comparator 32p, the 4-bit counter 33p outputs the counted value CNTp="0011".

When the counted value CNTp="0011" is output from the 4-bit counter 33p, the weighting selection circuit 35p will select the transistor P3-8 assigned to Bit 1, select the transistors P3-2 and P3-14 assigned to Bit 2, and supply a signal of L level to the gates of the transistors P3-8, P3-2, and P3-14.

As shown in the transistor operation table, the signal of L level is supplied to the gates of the transistors P3-8, P3-2, and P3-14, which are then turned on. When the transistors P3-8, P3-2, and P3-14 are turned on, the voltage Vpad will increase.

In this way, when the voltage Vpad of the terminal PAD2 is lower than the reference potential Vrefp, the 4-bit counter 33p sequentially counts up every time the clock signal ck rises, and the voltage Vpad will increase.

At a time instance t3 at which the clock signal ck rises, when the counted value CNTp of the 4-bit counter 33p is "1010", if the voltage Vpad of the terminal PAD2 exceeds the reference potential Vrefp, the comparator 32p supplies the signal Sp of a low level to the 4-bit counter 33p.

In this case, as shown in the transistor operation table, the transistors P3-2, P3-14, P3-4, P3-23, P3-6, P3-18, P3-25, P3-17, P3-27, and P3-9 are turned on because the signal of L level is supplied from the weighting selection circuit 35p to the gate thereof, respectively.

Each deviation from an average value of the DC characteristic of these transistors P3-4, P3-23, P3-6, P3-18, P3-25, P3-17, P3-27, P3-9, P3-2, and P3-14 is large as compared with that of the transistor P3-8. However, if the DC characteristics of these transistors are summed up, some of them are canceled out and therefore an influence of the variation in each DC characteristic on the voltage Vpad will decrease.

Moreover, even if the accuracy of the total value of the DC characteristics of these transistors is low, this accuracy is not a problem unless the voltage Vpad is a value in the vicinity of the reference potential Vrefp.

Upon supply of the signal of a low level from the comparator 32p, the 4-bit counter 33p outputs the counted value CNTp="1001".

When the counted value CNTp="1001" is output from the 4-bit counter 33p, the weighting selection circuit 35p will supply a signal of H level to the gates of the transistors P3-2 and P3-14 assigned to Bit 2, and supply a signal of L level to the gate of the transistor P3-8 assigned to Bit 1.

The transistors P3-2 and P3-14 are turned off because the signal of H level is supplied to the gate, and the transistor P3-8 is turned on because the signal of L level is supplied to the gate. Accordingly, the voltage Vpad will decrease.

The impedance adjustment circuit for PMOS 30p repeats such operations, and finally Bit 1 (LSB) of the counted value CNTp becomes "1" or "0".

Since the deviation from an average value of the DC characteristic of the transistor P3-8 is the smallest, the voltage Vpad becomes a voltage closest to the reference potential Vref as compared with the case where other PMOS transistors are turned on or off, which results in an increase in the accuracy of impedance adjustment.

As described above, according to this embodiment, weighting of a plurality of transistors is performed, and a transistor having the smallest deviation from an average value of DC characteristics is assigned to Bit 1 (LSB) of the 4-bit counters 33p and 33n, and then according to the weighting, $2^{(k-1)}$ transistors are assigned to the k-th bit.

Moreover, in the case where impedance adjustment is performed using 15 transistors, 30 transistors are formed in the impedance adjustment circuit 3 and 15 transistors are selected from them.

Accordingly, the voltage Vpad is determined by the accuracy of the transistor having the smallest deviation from an average value of DC characteristics. In other words, impedance adjustment can be performed with transistors having small variations, and the accuracy of impedance adjustment can be improved.

Note that, in implementing the present invention, various forms can be contemplated, and the present invention is not limited to the above-described embodiment.

For example, in the above embodiment, the operation of the impedance adjustment circuit for PMOS 30p has been described. However, the impedance adjustment circuit for NMOS 30n also operates in a similar manner.

In the above embodiment, the impedance adjustment circuit 3 has been described. However, if the output buffer 2 shown in FIG. 1 includes the comparators 32p and 32n, the 4-bit counters 33p and 33n, and the weighting selection circuits 35p and 35n, as with the impedance adjustment circuit 3, then this embodiment can be applied to the output buffer 2 in a similar manner.

Moreover, the LSI 100 may comprise the impedance adjustment circuit 3 and 20 output buffers 2, whereby codes output from the counter value holding circuits 34p and 34n can be distributed. However, the DC characteristics of 30 transistors×21=630 transistors need to be measured.

In the above-described embodiment, the mechanism of weighting of the transistors P3-1 to P3-30 and N3-1 to N3-30 is established using a transistor circuit. However, the method of realizing the mechanism is not limited thereto, and the weighting may be performed by a processor exclusively for diagnosis (DGP: Diagnostic Processor), for example. Moreover, information measured by a tester or the like may be selected by the DGP or the like during normal operation.

In the above-described embodiment, since the number of PMOS transistors and NMOS transistors is each 30, the 4-bit counters 33p and 33n are provided. However, the number of PMOS transistors and NMOS transistors is not limited to 30, respectively, and depending on this number the bit counter is also modified.

In the above-described embodiment, the reference of deviation for performing weighting of PMOS transistors and NMOS transistors has been described as an average value of each DC characteristic. However, the representative value is not limited to the average value, but may be a median or a mode, for example. Moreover, a preset reference value may be used.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

What is claimed is:

1. A semiconductor device, comprising:
an array circuit comprising a plurality of transistors connected in parallel, the respective impedance characteristics of which are known;
an impedance comparing element that compares a reference impedance with an impedance of the array circuit and outputs a result of the comparison;
a counter, which counts up or counts down the count value in accordance with the result of comparison output by the impedance comparing element; and
a controller which assigns a transistor having a smallest deviation from a representative value of the impedances of the transistors constituting the array circuit, to the least significant bit of the counter, and assigns $2^{(k-1)}$ number of transistors of other transistors to the k-th bit, where k is a natural number equal to or greater than 2, and turns on or off each transistor assigned to each bit of the count value based on the value of each bit,
wherein one or more of:
the controller weights each of the transistors of the array circuit based on the deviation from the representative value of the impedances of the transistors, and assigns $2^{(k-1)}$ number of transistors to the k-th bit, where k is a natural number equal to or greater than 2;
the counter cyclically counts up a count value or counts down the count value in accordance with the result of comparison output by the impedance comparing element, and the controller cyclically turns on or off each transistor assigned to each bit of the count value based on the count value of the counter.

2. The semiconductor device according to claim 1, wherein the impedance comparison element, the counter and the controller repeat comparing, counting and turning on and off each transistor, respectively, so that the impedance of the array circuit substantially coincides with the reference impedance.

3. The semiconductor device according to claim 1, wherein the array circuit includes more transistors than the transistors assigned to all the bits of the counter, and wherein the controller selects a transistor of the transistors of the array circuit in ascending order of their deviation from the representative value.

4. A method of adjusting impedance of an array circuit, the method comprising:
 an impedance comparison step of comparing a reference impedance with an impedance of an array circuit comprising a plurality of transistors connected in parallel, the respective impedance characteristics of which are known and outputting a result of the comparison;
 a step of updating a count value in response to a clock signal and in accordance with the result of comparison output in the impedance comparison step, and outputting the count value in a binary value;
 a step of assigning a transistor having a smallest deviation from a representative value of the impedances of the transistors of the array circuit, to the least significant bit of the count value, and assigning $2^{(k-1)}$ number of transistors of other transistors to the k-th bit, where k is a natural number equal to or greater than 1, and turns on or off each transistor assigned to each bit of the count value based on the count value output by the counter,
 wherein the method is further for adjusting an impedance of another array circuit comprising a substantially same structure as the array circuit and comprising a plurality of transistors connected in parallel, the respective impedance characteristics of which are known, the method further comprising:
 a step of weighting each transistor of said another array circuit based on a deviation from the representative value of the impedances of the transistors constituting said another array circuit;
 a step of assigning $2^{(k-1)}$ number of transistors of other transistors constituting the array circuit to the k-th bit of the count value, where k is a natural number equal to or greater than 1; and
 a step of turning on and off the transistor assigned to each bit based on the value of each bit of the counter value, thereby adjusting the impedance of said another array circuit to the reference impedance.

5. A semiconductor device, comprising:
 an array circuit comprising a plurality of transistors connected in parallel, the respective impedance characteristics of which are known;
 impedance comparing means that compares a reference impedance with an impedance of the array circuit and outputs a result of the comparison;
 counter means, which counts up or counts down the count value in accordance with the result of comparison output by the impedance comparing means; and
 controller means which assigns a transistor having a smallest deviation from a representative value of the impedances of the transistors of the array circuit, to the least significant bit of the counter means, and assigns $2^{(k-1)}$ number of transistors of other transistors to the k-th bit, where k is a natural number equal to or greater than 2, and turns on or off each transistor assigned to each bit of the count value based on the value of each bit.

* * * * *